United States Patent
Nakagawa et al.

(10) Patent No.: US 6,313,764 B1
(45) Date of Patent: Nov. 6, 2001

(54) DEMODULATING DEVICE, DEMODULATING METHOD AND TRANSMISSION MEDIUM

(75) Inventors: Toshiyuki Nakagawa; Tatsuya Narahara; Yoshihide Shinpuku, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/154,528

(22) Filed: Sep. 17, 1998

(30) Foreign Application Priority Data

Sep. 19, 1997 (JP) .................................... 9-254599

(51) Int. Cl.[7] .................................................. H03M 7/00
(52) U.S. Cl. ................................................ 341/59; 341/58
(58) Field of Search ................... 341/58, 59, 50

(56) References Cited

U.S. PATENT DOCUMENTS

| | | | |
|---|---|---|---|
| 5,432,799 | * 7/1995 | Shimpuku et al. | 341/59 |
| 5,701,310 | * 12/1997 | Deguchi et al. | 341/59 |
| 6,127,951 | * 10/2000 | Nakagawa et al. | 341/59 |

FOREIGN PATENT DOCUMENTS

| | | | |
|---|---|---|---|
| 347934 | * 12/1989 | (EP) | G11B/20/14 |
| 0 555 832 | 8/1993 | (EP) | G11B/20/14 |
| 0 560 339 | 9/1993 | (EP) | H03M/7/40 |
| 0 571 905 | 12/1993 | (EP) | G11B/20/14 |
| 0 577 402 | 1/1994 | (EP) | G11B/20/10 |
| 0 617 517 | 9/1994 | (EP) | H03M/5/14 |
| 655850 | * 5/1995 | (EP) | H04L/25/49 |
| 0 744 838 | 11/1996 | (EP) | H03M/7/14 |
| 0 880 234 | 11/1998 | (EP) | H03M/5/14 |
| 0 902 544 | 3/1999 | (EP) | H03M/5/14 |
| 0 923 077 | 6/1999 | (EP) | G11B/20/14 |

* cited by examiner

*Primary Examiner*—Peguy JeanPierre
(74) *Attorney, Agent, or Firm*—Frommer Lawrence & Haug LLP; William S. Frommer; Dennis M. Smid

(57) ABSTRACT

According to the present invention, in the demodulating device, demodulating method and transmitting medium, a channel bit sequence of a variable length code having a minimum run d of 1 or more was decoded to a data sequence, and a code assigned to limit the minimum run d from repeating a predetermined number of times in the channel bit sequence of the variable length code was decoded to a data sequence. Design is therefore easier from the viewpoint of clock reproduction. When all the elements in the table contain a "1" representing an edge, data can be decoded more reliably. Further, when omissions are made in the codes in the table up to d bits from the code sequence lengths of the restriction lengths, data can be decoded more reliably. Thus, a clock is stably reproduced.

8 Claims, 2 Drawing Sheets

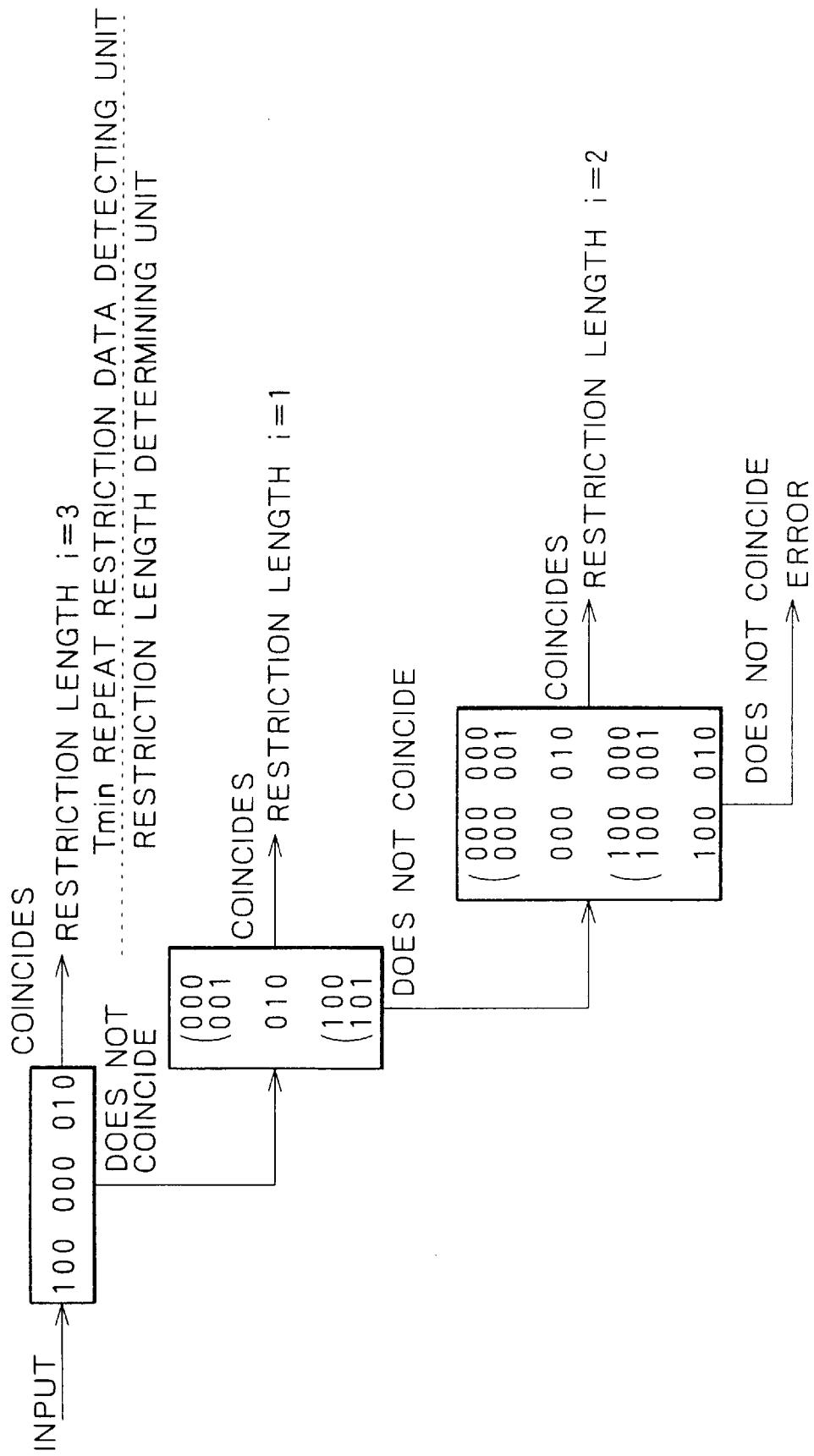

DEMODULATING DEVICE, DEMODULATING METHOD AND TRANSMISSION MEDIUM

BACKGROUND OF THE INVENTION

1. Field of the Invention

This invention relates to a demodulating device, demodulating method and transmission medium, and in particular to a demodulating device, demodulating method and transmission medium which are suitable for demodulating a modulation code obtained by modulating data for application to data transmission or recording on a recording medium so as to reproduce data.

2. Description of the Related Art

When data is transmitted on a predetermined transmission path or recorded for example on recording media such as magnetic disks, optical disks, and magneto-optical disks, data modulation is performed which is suitable for the transmission or recording. One such type of modulation is known as block coding. This block coding converts a data sequence to blocks of m×i bit units (referred to hereafter as data words), and this data word is converted to a code word comprising n×i bits according to a suitable code rule.

When i=1, this code is a fixed length code expressed by (d,k;m,n;1). When plural i are selected, a predetermined i is selected from the range 1 to imax (maximum value of i) and the conversion is performed, the code is a variable-length code. This block encoded code is represented by a variable length code (d,k;m,n;r).

Here, i is known as a restriction length, and imax is r (the maximum restriction length). The minimum run d shows the minimum number of consecutive "0"s in repeated "1"s in the code sequence. The maximum run k shows the maximum number of consecutive "0"s in repeated "1"s in a code sequence.

In compact disks or mini-discs (trademark) etc., NRZI (Non Return to Zero Inverted) modulation, wherein "1" means inversion and "0" means non-inversion, is performed on the variable length code obtained as above, and the NRZI modulated variable length code (hereafter, referred to as a recorded waveform sequence) is recorded. This recorded waveform sequence will be referred to also as a level code.

When this level code is inverted so that "1" is replaced by "0" or "0" is replaced by "1", i.e. when reverse NRZI modulation is performed wherein "1" indicates an edge, the same code sequence as the original EFM code or RLL(1-7) code can be obtained. This reverse NRZI code sequence will also be referred to as an edge code.

Various modulation techniques have been proposed. If the minimum inversion interval of the recorded waveform sequence is Tmin and the maximum inversion interval is Tmax, to record at a high density in a linear velocity direction, the minimum inversion interval Tmin should be long, that is, the minimum run d should be large. From the clock reproduction aspect, moreover, the maximum inversion interval Tmax should be short, that is, the maximum run k should be small.

For example, one modulation technique used by magnetic disks or magneto-optical disks, etc., is RLL(2-7) The parameters of this modulation method are (2,7;1,2;3) If the bit interval of the recording waveform sequence is T, the minimum inversion interval Tmin (=(d+1)T) is 3(=2+1)T. If the bit interval of the data sequence is Tdata, this minimum inversion interval Tmin is $1.5(=(m/n)\times Tmin =(\frac{1}{2})\times 3)$Tdata. The maximum inversion interval Tmax (=(k+1)T) is 8(=7+1)T (=((m/n)×Tmax)Tdata=($\frac{1}{2}$)×8Tdata =4.0Tdata). A detection window width Tw (=(m/n)T)) is 0.5(=½)Tdata.

Another modulation technique used by magnetic disks or magneto-optical disks, etc., is RLL(1-7). The parameters of this modulation method are (1,7;2,3;2). The minimum inversion interval Tmin is 2(=1+1) T (=⅔×2Tdata=1.33Tdata). The maximum inversion interval Tmax is 8(=7+1) T(=(⅔)× 8Tdata=5.33Tdata). Further, the detection window width Tw(=(m/n)XT) is 0.67(=⅔ data.

Comparing RLL(2-7) and RLL(1-7), for example in a magnetic disk system or magneto-optic disk system, to increase recording density in the linear velocity direction, RLL (2-7) for which the minimum inversion interval Tmin is 1.5 data preferable to RLL(1-7) for which the minimum inversion interval Tmin is 1.33 data. In practice, however, RLL(2-7) which has a larger detection window width Tw than RLL(2-7) and which is said to have a large tolerance to jitter, widely used.

The conversion table for the RLL(1-7) code is, for example, as follows.

TABLE 1

| RLL (1, 7; 2, 3; 2) | | |
|---|---|---|
| | Data | Code |
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

Herein, the symbol x in the conversion table is given the value 1 when the following channel bit is 0, and given the value 0 when the following channel bit is 1 (same hereafter). The restriction length r is 2.

The conversion table for the RLL(2-7) code for which the minimum run d=2 and the maximum inversion interval Tmax is 8T (maximum run 7), is for example as shown below.

TABLE 2

| RLL (2, 7; 1, 2; 3) | | |
|---|---|---|
| | Data | Code |
| i = 1 | 11 | 1000 |
| | 10 | 0100 |
| i = 2 | 011 | 001000 |
| | 010 | 100100 |
| | 000 | 000100 |
| i = 3 | 0011 | 00001000 |
| | 0010 | 00100100 |

The restriction length r is 3.

However, in a channel bit sequence which is modulated by RLL(1-7), the occurrence frequency of 2T which is Tmin is the greatest, followed by 3T and 4T. In general, if many periods occur wherein a large amount of edge information occurs early as in the case of 2T and 3T, this is advantageous for clock reproduction. However, if 2T occurs repeatedly, distortion of the recorded waveform occurs more easily. Specifically, the output waveform amplitude of 2T is small, and easily affected by defocusing or tangential tilt. Further, at a high linear density, recordings wherein the minimum mark is repeated are easily affected by external disturbances such as noise so that data reproduction errors tend to occur.

RLL(1-7) is often combined with PRML (Partial Response Maximum Likelihood), to improve S/N during playback of a high density recording. This method comprises, for example, Viterbi decoding equalized by PR(1,1) or PR(1,2,1) by matching the RF reproduction waveform to media characteristics. For example, a desirable reproduction output when equalization is performed by PR(1,1) is as follows.

```
    1    0    1    0    0    1    0    (channel bit data sequence)
    1    1    0    0    1    0    0    (after NRZI conversion)
   ...  ...
    1    1
         1    1
             -1   -1
                 -1   -1
                          1    1
                               1    1
                                   -1   -1
                                    ...  ...
...+2    0   -2    0   +2    0    ...(reproduction output)
```

The data after this NRZI conversion is level data. When the channel bit data is 1, it is given a different value (0 or 1) from the immediately preceding value (1 or 0), and when the channel bit data is 0, it is given the same value (0 or 1) as the immediately preceding value (0 or 1). In this example, when the value after NRZI conversion is 1, "11" is decoded, and when the value after NRZI conversion is "0", "-1-1" is decoded. Waveform equalization when 2T which is Tmin is repeated, is performed to obtain this reproduction output. In general, waveform interference becomes longer the higher the linear density, therefore, waveform equalization also becomes longer as in PR(1,2,2,1) or PR(1,1,1,1).

However when the minimum run d=1 and a suitable waveform equalization is PR (1,1,1,1) as a result of high linear density, considering a situation when 2T which is Tmin occurs repeatedly, the reproduced signal at that time is

```
 1   0   1   0   1   0   1   0   1   0  (channel bit data sequence)
 1   1   0   0   1   1   0   0   1   1  (after NRZI conversion)
...  ...
 1   1   1   1
     1   1   1   1
        -1  -1  -1  -1
            -1  -1  -1  -1
                 1   1   1   1
                     1   1   1   1
                        -1  -1  -1  -1
                         ...  ...
         ...  0   0   0   0   ...   (reproduction output).
``` and the zero level will be traced for a long time.

This shows that a situation when practically no signal level is output after waveform equalization continues, and therefore Viterbi decoding does not merge. This also causes considerable loss of data reproduction or clock reproduction stability.

This kind of channel bit data sequence, for example in the case of RLL (1,7;2,3;2) in Table 1, occurs when the pre-modulated data sequence is "10-01-10-01-10- . . . "

Similarly, in the case of RLL (2,7;1,2;3) in Table 2, the premodulated data sequence is "010-010-010-010- . . . "

In this regard, the inventors already proposed the use of a code for limiting repetition of Tmin in Patent Application No. Hei 9-133379.

According to this proposal, when the variable length code (d,k;m,n;r) is, for example, a variable length code (1,7,2,3;3), i.e. when d which is the minimum run of "0" is 1 bit, k which is the maximum run of "0" is 7 bits, m which is basic data length is 2 bits, n which is the basic code length is 3 bits, and r which is the maximum restriction length is 3, the conversion table is such as is shown for example in the following Table 3.

TABLE 3

RML (1, 7; 2, 3; 3)

|  | Data | Code |
|---|---|---|
| i = 1 | 11 | 00x |
|  | 10 | 010 |
|  | 01 | 10x |
| i = 2 | 0011 | 000 00x |
|  | 0010 | 000 010 |
|  | 0001 | 100 00x |
|  | 0000 | 100 010 |
| i = 3 | 100110 | 100 000 010 |

The restriction length r is 3.

In the above Table 3, when the data sequence is "10", and in particular when the following four bits of data are looked up so that the total six (bit) data sequence is "100110", by converting data to a code which limits repetition of the minimum run, the minimum run can be repeated up to 5 times by the modulation of Table 3.

Comparing with RLL(1-7) of Table 1, the minimum run and maximum run are the same, and the conversion ratio m/n (ratio of data words and converted code words) is the same, but the restriction length has increased from 2 to 3. This shows that the maximum size of the table has increased, and shows that error propagation often increases when, for example, a bit shift error occurs during demodulation.

A bit shift error is an error wherein a "1" representing the edge in the code sequence is shifted one bit forward or backward. The error propagation is expressed as a number of bits from the start to the end of a demodulation error produced when a code sequence, in which an error occurs at one position due for example to a bit shift error, is decoded without modification.

This bit shift error is the form of error which occurs most frequently during data reproduction in an actual recording/playback device, and it has been found to occur exclusively in the vicinity of the minimum run.

As an example of modulation of codes other than these, when the variable length code (d,k;m,n;r) is a variable length code (2,7;1,2;4), i.e. when d which is the minimum run of "0" is 2 bits, k which is the maximum run of "0" is 7 bits, m which is the basic data length is 1 bit, n which code length is 2 bits, and r which is the maximum restriction length is 4, the conversion table is such as is shown for example in the following table.

TABLE 4

RML (2, 7; 1, 2; 4)

|  | Data | Code |
|---|---|---|
| i = 1 | 11 | 1000 |
|  | 10 | 0100 |
| i = 2 | 011 | 001000 |
|  | 010 | 100100 |
|  | 000 | 000100 |
| i = 3 | 0011 | 00001000 |
|  | 0010 | 00100100 |

The restriction length r is 4.

In the above Table 4, when the data sequence is "010", and in particular when the following two bits of data are looked up so that the total five (bit) data sequence is "01001", by converting data to a code which limits repetition of the minimum run, the minimum run can be up to 4 times by the modulation of Table 4.

Comparing with RLL(2-7) of Table 2, the minimum run and maximum run are the same, and the conversion ratio m/n is the same, but the restriction length has increased from 3 to 4. This shows that the maximum size of the table has increased as described above, and shows that error propagation often increases when, for example, a bit shift error occurs during demodulation.

When, as described above, recording media such as magnetic disks, magneto-optic disks or optical disks are recorded at high density, and codes with a long minimum run such as RLL(1-7) or RLL(2-7) are selected as modulation codes, if the minimum inversion interval Tmin occurs repeatedly, recording and playback distortion occurs easily which is disadvantageous for clock reproduction.

When high linear density (recording) is performed and PR(1,1,1,1) equalization is performed with a d=1 code, if the minimum inversion interval Tmin is repeated, the logic of the reproduced signal outputs zero continuously and Viterbi decoding does not merge, which is disadvantageous for clock reproduction.

This invention, which was conceived in view of the above problems, therefore adds a code which limits the minimum inversion interval Tmin from repeating for a long time, to a conversion table as in the prior art, e.g. RLL(1-7) or RLL(2-7), and performs demodulation processing by a table RML(1-7) method or RML(2-7) method whereby clock reproduction is rendered more stable.

However, this RML(1-7) method has a longer restriction length than RLL(1-7) of the prior art and RML(2-7) has a longer restriction length than RLL(2-7) of the prior art, so when bit shift errors occur in the reproduced data obtained from a recording/playback device, error propagation during data decoding becomes longer.

SUMMARY OF THE INVENTION

To deal with this situation, this invention shortens error propagation when bit shift errors occur, for example with RML(1-7) or RML(2-7), or RLL(1-7) or RLL(2-7) of the prior art.

The demodulating device of claim 1 comprises a comparator means which compares a reproduced signal with a predetermined level, and outputs a code sequence for inserting a minimum of d and a maximum of k "0"s in a continuous series of"1"s, and a decoding means for decoding a restriction code, assigned to limit a minimum run d of 1 or more from repeating a predetermined number of times in a code sequence of "1"s and "0"s, into a predetermined data sequence.

The demodulating method of claim 8 comprises a comparator step which compares a reproduced signal with a predetermined level, and outputs a code sequence for inserting a minimum of d and a maximum of k "0"s in a continuous series of "1"s, and a decoding step for decoding a restriction code, assigned to limit a minimum run d of 1 or more from repeating a predetermined number of times in a code sequence of "1"s and "0"s, into a predetermined data sequence.

The transmitting medium of claim 9 transmits a program comprising a comparator step which compares a reproduced signal with a predetermined level, and outputs a code sequence for inserting a minimum of d and a maximum of k "0"s in a continuous series of "1"s, and a decoding step for decoding a restriction code, assigned to limit a minimum run d of 1 or more from repeating a predetermined number of times in a code sequence of "1"s and "0"s, into a predetermined data sequence.

In the demodulating device of claim 1, demodulating method of claim 8 and transmitting method of claim 9, a reproduced signal is compared with a predetermined reference level, a code sequence is output wherein a minimum of d and a maximum of k "0"s are inserted in a continuous series of "1"s, and a restriction code assigned to limit a minimum run d of 1 or more from repeating a predetermined number of times in the code sequence of "1"s and "0"s is decoded into a predetermined data sequence.

BRIEF DESCRIPTION OF THE DRAWINGS

FIG. 2 is a diagram describing the operation of the restriction length determining unit 12 of FIG. 1.

DETAILED DESCRIPTION OF THE PREFERRED

Figure 1:
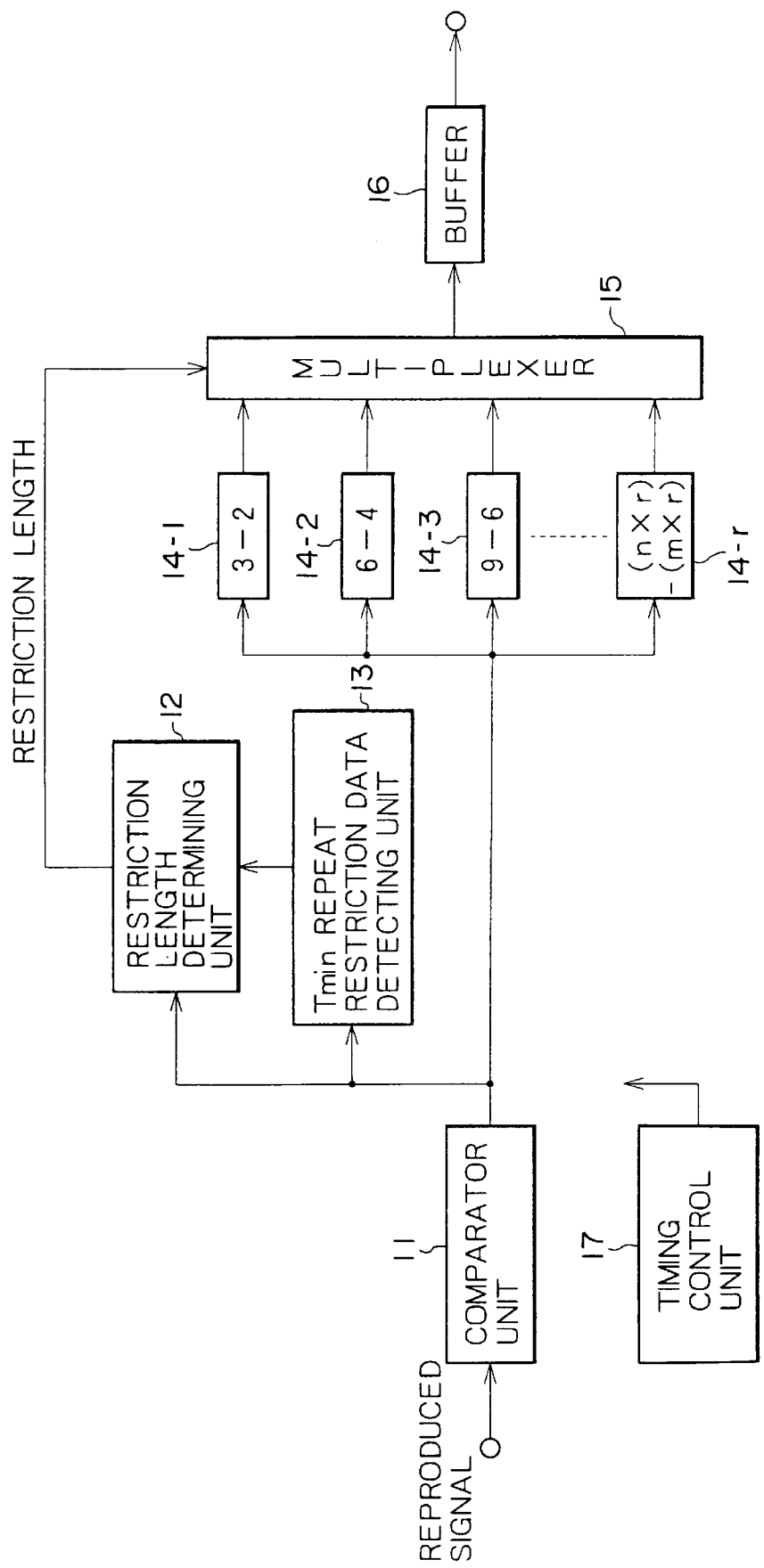
FIG. 1 is a block diagram showing the construction of one embodiment of the demodulating device of this invention.

Some forms of this invention will now be described, and to clarify the correspondence relation between the means of the invention as specified in the appended claims and the embodiments described below, the corresponding embodiment is added in brackets (as an example) after the means. It will of course be understood that these embodiments are not limited to the means for which such a correspondence is indicated.

The demodulating device of claim 1 comprises a comparator means (e.g. a comparator unit 11 of FIG. 1) which compares a reproduced signal with a predetermined level, and outputs a code sequence for inserting a minimum of d and a maximum of k "0"s in a continuous series of "1"s, and a decoding means (e.g. reverse conversion tables 14-1 to 14-r of FIG. 1) which decodes a restriction code, assigned to limit a minimum run d of 1 or more from repeating a predetermined number of times in the code sequence of "1"s and "0"s, into a predetermined data sequence.

The demodulating device of claim 2 further comprises a detecting means (e.g. a Tmin repeat restriction data detecting unit 13 of FIG. 1) for detecting a restriction code from the code sequence of "1"s and "0"s, and a restriction length determining means (e.g. a restriction length determining unit 12 of FIG. 1) for determining a restriction length of the code sequence from the output of the detecting means and the code sequence of "1"s and "0"s.

The demodulating device of claim 3 further comprises a selecting means (e.g. a multiplexer 15 of FIG. 1) for selecting, corresponding to the restriction length, a decoding result obtained by the decoding means, which decodes a code in which the restriction code is determined into an m bit data sequence from an n bit code sequence using plural tables corresponding to the restriction length.

One embodiment of the demodulating device according to this invention will now be described with reference to the drawings. This embodiment relates to the application of the invention to a demodulating device which decodes a modulation code obtained by converting data to a variable length code (d,k;m,n;r). FIG. 1 is a block diagram of a specific circuit construction of the demodulating device using RML (1-7) of Table 3.

As shown in FIG. 1, the demodulating device comprises the comparator unit 11 which binarizes a signal from a transmission path or a signal reproduced from a recording medium. The comparator unit 11 also reverse NRZI encodes (edge encodes) the input signal when the signal is NRZI modulated (level encoded). The restriction length determining unit 12 receives the digitized signal from the comparator unit 11, and determines a restriction length i. The Tmin repeat restriction code detecting unit 13 detects a special pattern (restriction code) for limiting repetition of Tmin in the digitized signal from the comparator unit 11, and sends this information to the restriction length determining unit 12.

The reverse conversion tables 14-1 to 14-r comprise a table (effectively the same conversion table as that shown in Table 3) which reverse converts an n ×1 bit variable length code into m×i bits of data. Herein, i=1, 2. . . , r. The multiplexer 15 selects any of the data from the reverse conversion tables 14-1 to 14-r, and outputs it as serial data. A buffer 16 temporarily stores the data from the multiplexer 15, and outputs it as reproduction data. A timing control unit 17 generates a timing signal, and supplies it to the comparator unit 11, restriction length determining unit 12, Tmin repeat restriction data detecting unit 13 and buffer 16.

Next, the operation of the demodulating unit will be described. The signal transmitted via the transmission path or reproduced from the recording medium is input to the comparator unit 11, compared with a predetermined reference level, and binarized. The signal output from the comparator unit 11 is a reverse NRZI code (code wherein "1" shows the edge) digital signal which is input to the restriction length determining unit 12, where the restriction length is determined. The digital signal is also input to the Tmin repeat restriction data detecting unit 13, where a special pattern limiting repetition of the minimum run is detected, and the detection result is output to the restriction length determining unit 12.

The restriction length determining unit 12 comprises a conversion table shown in Table 1 (its reverse conversion table) (table of i=1 and i=2 in Table 3). The Tmin repeat restriction data detecting unit 13 comprises a conversion table (table of i=3) provided for limiting repetition of Tmin in the conversion table shown in Table 3. The restriction length determining unit 12 and Tmin repeat restriction data detecting unit 13 actually comprise Table 3 split into two, and the restriction length of the input modulation code is determined as follows.

First, determination of an non-specific code will be described. For example, if the input code is "100", this code may be any non-specific code for a restriction length i=1, "100010", "10000x" for a restriction length i=2, or "100000010" for a restriction length i=3. It is impossible to determine, from a three bit code alone, which of these codes it is. Therefore, the restriction length determining unit 12 receives a further three bit code input, and if the total six bit code matches "100010" or "1000x", it is determined that the restriction length i is 2.

In addition to the first three bits, the Tmin repeat restriction data detecting unit 13 receives a six bit code input, looks up a total nine bit code, and determines whether or not it matches "100000010". When it matches, it is determined that this code is the Tmin repeat restriction data pattern (restriction code), and outputs the determination result to the restriction length determining unit 12. If a signal showing that this is the Tmin repeat restriction data pattern is input from the Tmin repeat restriction data detecting unit 13, the restriction length determining unit 12 first determines that the restriction length i=3. If the code does not match these examples, it determines that the code comprises the first three bits, and determines that the restriction length i=1.

When the code "101" is input, it is determined that this code is the i=1 code "101".

When the input three bit code is "000", this code is any of the i=1 code "000", or i=2 codes "00000x ", "000010". In this case also, as in the case described above, a further three bit code input is received after the three bit code, and it is determined whether or not the total six bit code matches "00000×" or "000010". When it matches, it is determined that i=2. When it does not match, the first three bit code, "000", is regarded as one code, and it is assumed that i=1.

When the input code is "001", it is determined that this code is the i=1 code "001".

When the input code is "100001", it is determined that this code is the i=2 code "10000x ".

When the input code is "10000", it is possible to determine that this code is the i=2 code "1000x " by looking at one more bit, and examining whether the total seven bits is "100001".

When the input code is "000000", and "000001", it is determined that this code is the i=2 code "00000x".

In addition, regarding codes other than non-specific codes, when bits comprising one code are input, the restriction length i can be determined immediately from the number of bits. Specifically, for the codes "010", "100010", "000010", the restriction length can be determined immediately at the time these codes are input.

FIG. 2 shows a summary of the above processing.

In the reverse conversion table 14-1, the data "01" is written to the addresses "100" and "101", the data "10" is written to the address "010", and the data "11" is written to the addresses "000" and "001". Therefore, when the code "100" or "101 " is input, the data "01" is output, when the code "010" is input, the data "10" is output, and when the code "000" or "001" is input, the data "11" is output.

The reverse conversion tables 14-2 to 14-r also perform the reverse conversion processing shown in Table 3 and output data.

The multiplexer 15 selects the output of the reverse conversion tables 14-i according to the restriction length determining result of the restriction length determining unit 12 from the data supplied by the reverse conversion tables 14-1 to 14-r, and outputs it as serial data to the buffer 16. Specifically, when the restriction length i is 1, the multiplexer 15 selects the table 14-1, and serially outputs two bits of demodulated data. When the restriction length i=2, the multiplexer 15 serially outputs four bits of demodulated data. When the restriction length i=3, the multiplexer 15 serially outputs six bits of demodulated data. The buffer 16 temporarily stores the input serial data, reads it at a predetermined transfer rate, and outputs it.

Next, the construction of the restriction length determining unit 12 and Tmin repeat restriction data detecting unit 13 will be described. The restriction length may be determined when it can be distinguished from other patterns. First, the inverse table of Table 3 is as shown in Table 5. When the input code sequence is a code sequence shown in this Table 5, its restriction length is determined, and the demodulated data sequence is also determined.

TABLE 5

Reverse RML (1, 7; 2, 3; 3)

| | Code sequence | Demodulated data sequence |
|---|---|---|
| i = 1 | 001 | 11 |
| | 0001 | 11 |
| | 010 | 10 |
| | 101 | 01 |
| | 1001 | 01 |
| i = 2 | 000 001 | 0011 |
| | 000 000 | 0011 |
| | 000 010 | 0010 |
| | 100 001 | 0001 |
| | 100 0001 | 0001 |
| | 100 010 | 0000 |
| i = 3 | 100 000 010 | 100110 |

The table i=1 or i=2 is stored in the restriction length determining unit 12, and the table i=3 is stored in the Tmin repeat restriction code data detecting unit 13.

When demodulation processing is performed based on Table 5, and there is a bit shift error, the error propagation length during demodulation is a maximum of 10 data bits.

The same demodulation processing as that of Table 5 may be performed on a small table (small number of bits in the code sequence for i=3), as shown in Table 6. Specifically, in Table 5 when i=3, the corresponding demodulated data is determined when a 9 bit code sequence is obtained. On the other hand, in Table 6 when i=3, the corresponding demodulated data is determined when a 7 bit code sequence is obtained. When the table is made smaller in this way, the scale of the hardware can be reduced, and the determining time can be shortened.

TABLE 6

Reverse RML (1.7; 2, 3; 3)

| | Code sequence | Demodulated data sequence |
|---|---|---|
| i = 1 | 001 | 11 |
| | 0001 | 11 |
| | 010 | 10 |
| | 101 | 01 |
| | 1001 | 01 |
| i = 2 | 000 00- | 0011 |
| | 000 01- | 0010 |
| | 100 001 | 0001 |
| | 100 0001 | 0001 |
| | 100 01- | 0000 |
| i = 3 | 100 000 0- - | 100110 |

In this table, "–" represents any bit (both 1 and 0 are acceptable) (same hereafter). The table i=1 or i=2 is stored in the restriction length determining unit 12, and the table i=3 is stored in the Tmin repeat restriction code data detecting unit 13.

When demodulation processing is performed using Table 6 and a bit shift error occurs, the error propagation length in demodulation is a maximum of 10 data bits.

However, when a long error propagation pattern was analyzed and it was attempted to shorten the error propagation length, the following table was obtained.

TABLE 7

Reverse RML (1, 7; 2, 3; 3)

| | Code sequence | Demodulated data length |
|---|---|---|
| i = 1 | 001 | 11 |
| | 0001 | 11 |
| | 010 | 10 |
| | 101 | 01 |
| | 1001 | 01 |
| i = 2 | 000 00- | 0011 |
| | 000 01- | 0010 |
| | 100 001 | 0001 |
| | 100 0001 | 0001 |
| | 100 01- | 0000 |
| i = 3 | 100 000 01- | 100110 |

The table i=1 or i=2 is stored in the restriction length determining unit 12, and the table i=3 is stored in the Tmin repeat restriction code data detecting unit 13.

The error propagation length when demodulation is performed using Table 7 and a bit error is generated, is a maximum of 8 bits. This is shorter than the example of Table 5 or Table 6. The error propagation length in Table 5 and Table 6 is 10 bits, but in terms of symbol units which are 8 bits, this is 3 symbols. In other words, if all 10 bits are errors, all the bits of one symbol are errors, and one bit of the forward and backward symbols is an error, so the number of symbols containing errors is 3. On the other hand, as the worst error propagation of Table 7 is 8 bits, this is 2 symbols in symbol units at worst. Hence, by improving the demodulation method, the worst symbol error propagation is reduced to ⅔ (symbol ratio).

In this way, by performing the demodulation determination as soon as possible when data demodulation is performed, the scale of hardware can be reduced, and worst error propagation characteristics during bit shift error can be improved. For this purpose, error propagation characteristics must be considered, but this may not be effective even for the smallest table (table when there are 7 bits in the code sequence for i=3) as in Table 6. Therefore, "1" in the code sequence is not omitted (restriction code is determined by 8 bits), as shown for example in Table 7, even when the restriction code can be determined by 7 bits.

Summarizing, even when all the elements (bits) are listed for restriction length determining and the decoding table, a short worst error propagation is not necessarily achieved. Further, even when the last two bits ((d+1) bits) are missing in the restriction length i=3 as in Table 6, a short worst error propagation is not necessarily achieved. Further, even when the "1" signifying the edge is omitted due to the fact that the restriction length is already determined for i=3, as in Table 6, a short worst error propagation is not necessarily achieved.

Considering the demodulation method using the prior art RLL(1-7) (Table 1) in the same way, Table 8 and Table 9 are obtained.

TABLE 8

Reverse RLL (1, 7; 2, 3; 2)

| | Code sequence | Demodulated data sequence |
|---|---|---|
| i = 1 | 001 | 11 |
| | 0001 | 11 |
| | 010 | 10 |

TABLE 8-continued

Reverse RLL (1, 7; 2, 3; 2)

| | Code sequence | Demodulated data sequence |
|---|---|---|
| | 101 | 01 |
| | 1001 | 01 |
| i = 2 | 000 00- | 0011 |
| | 000 01- | 0010 |
| | 100 00- | 0001 |
| | 100 01- | 0000 |

TABLE 9

Reverse RLL (1, 7; 2, 3; 2)

| | Code sequence | Demodulated data sequence |
|---|---|---|
| i = 1 | 001 | 11 |
| | 0001 | 11 |
| | 010 | 10 |
| | 101 | 01 |
| | 1001 | 01 |
| i = 2 | 000 00- | 0011 |
| | 000 01- | 0010 |
| | 100 001 | 0001 |
| | 100 0001 | 0001 |
| | 100 01- | 0000 |

Specifically, in Table 9, the 3rd code "100001" and the 4th code "1000001" for i=2 can be demodulated as the 3rd "10000-" for i=2 in Table 8. However, the worst error propagation when there is a bit shift in Table 8 is 6 bits, and this can be reduced to 5 bits by adopting Table 9.

Summarizing, even if the last 1 bit (d bits) is omitted from all the elements for a restriction length i=2 in restriction length determining and the decoding table, the worst error propagation is not necessarily shortened.

However, a code modulated by the aforesaid prior art RLL(1-7) (Table 1) may be demodulated also using Table 7, which is a RML(1-7) table. This is because code sequences with a restriction length r-1 and r=2 in Table 7 contain all the code sequences with a restriction length r=1 and r=2 in Table 9, which is a prior art (1-7) table. When modulation is performed by the prior art RLL(1-7) code (Table 1), the code sequence "100000010" which is a restriction code is not generated. Therefore, RML(1-7) tables (e.g. Table 7) can demodulate code sequences modulated by RML(1-7) (Table 3), and can also demodulate code sequences modulated by the prior art RLL(1-7) (Table 1). In other words, Table 7 and Table 9 are interchangeable.

Also, when for example a RML (2-7) code such as in Table 4 is demodulated, the restriction length i part is retained in the reverse conversion tables 14 i of the demodulating device of FIG. 1. In the case of RML(2-7) codes, there are no non-specific bits. Further, as the conversion rate of RML (2-7) is ½, the output of the comparator unit 11 is two code word units, and the restriction length is from i=1 to i=4. When i=4, the code is a special pattern supplied to limit the repetition of minimum runs.

The construction of the restriction length determining unit 12 and Tmin repeat restriction data detecting unit 13 will be described for P(2-7) codes. The restriction length is determined when it can be distinguished from other patterns. First, generating the inverse table of Table 4, Table 10 is obtained.

TABLE 10

Reverse RML (2, 7; 1, 2; 4)

| | Code sequence | Demodulated data sequence |
|---|---|---|
| i = 1 | 10 00 | 11 |
| | 01 00 | 10 |
| i = 2 | 00 10 00 | 011 |
| | 10 01 00 | 010 |
| | 00 01 00 | 000 |
| i = 3 | 00 00 10 00 | 0011 |
| | 00 10 01 00 | 0010 |
| i = 4 | 00 00 10 01 00 | 01001 |

Using this Table 10, the error propagation length when a bit shift error is generated and demodulation is performed is a maximum of 10 data bits.

By determining the code sequence at an early stage, Table 10 can be made smaller as shown in Table 11. The same demodulation as in the case of Table 10, can also be performed with Table 11. By making the table smaller, there are advantages in that the scale of hardware can be reduced and the determining time can be shortened, as mentioned above.

TABLE 11

Reverse RML (2, 7; 1, 2; 4)

| | Code sequence | Demodulated data sequence |
|---|---|---|
| i = 1 | 10 00 | 11 |
| | 01 00 | 10 |
| i = 2 | 00 10 00 | 011 |
| | 10 01 - - | 010 |
| | 00 01 - - | 000 |
| i = 3 | 00 00 10 00 | 0011 |
| | 00 10 01 - - | 0010 |
| i = 4 | 00 00 10 01 - - | 01001 |

Using this Table 11, the error propagation when a bit shift error is generated and demodulation is performed is a maximum of 9 data bits.

The worst error propagation of Table 10 when a bit shift error is generated is 10 bits, but in terms of 8 bit symbol units, this is 3 symbols. On the other hand, the worst error propagation of Table 11 is 9 bits, which is 2 symbols in symbol units. Therefore, by improving the demodulating method, the worst symbol error propagation can be reduced to ⅔.

In data demodulation, by performing the demodulation determination at an early stage, the scale of hardware can be reduced, and worst error propagation characteristics when there is a bit shift error can be improved. For this purpose, however, the "1" information in the code sequence is not omitted as in Table 11, even if the restriction code can be determined with a fewer number of bits.

Summarizing the above, even when all the elements are listed for the restriction length and decoding table as in Table 10, it is not necessarily possible to shorten the worst error propagation. On the other hand, the last d bits are omitted for a restriction length i=2 and restriction length i=3, and as d=2 in this case, when (2) bits are omitted, there is a possibility that the worst error propagation can be made shorter.

Considering demodulation using the prior art RLL (2-7) (Table 2) in the same way, Table 12 is obtained, and if this is further shortened, Table 13 is obtained.

TABLE 12

Reverse RLL (2, 7; 1, 2; 3)

| | Code sequence | Demodulated data sequence |
|---|---|---|
| i = 1 | 10 00 | 11 |
| | 01 00 | 10 |
| i = 2 | 00 10 00 | 011 |
| | 10 01 00 | 010 |
| | 00 01 00 | 000 |
| i = 3 | 00 00 10 00 | 0011 |
| | 00 10 01 00 | 0010 |

TABLE 13

Reverse RLL (2, 7; 1, 2; 3)

| | Code sequence | Demodulated data sequence |
|---|---|---|
| i = 1 | 10 00 | 11 |
| | 01 00 | 10 |
| i = 2 | 00 10 00 | 011 |
| | 10 01 - - | 010 |
| | 00 01 - - | 000 |
| i = 3 | 00 00 10 - - | 0011 |
| | 00 10 01 - - | 0010 |

In the example of Table 12, the error propagation when a bit shift error is generated is a maximum of 6 bits. However, in the example of Table 13, the error propagation when a bit shift error is generated continues infinitely when it is a maximum. Therefore, by adding a new determination limitation as shown in Table 14, the error propagation becomes finite and can be made shorter.

TABLE 14

Reverse RLL (2, 7; 1, 2; 3)

| | Code sequence | Demodulated data sequence |
|---|---|---|
| i = 1 | 10 00 | 11 |
| | 01 00 | 10 |
| i = 2 | 00 10 00 | 011 |
| | 10 01 - - | 010 |
| | 00 01 - - | 000 |
| i = 3 | 00 00 10 00 | 0011 |
| | 00 10 01 - - | 0010 |

In this Table 14, there are two codes for i=3. In one of them the last two bits are missing, but the other contains all the bits. The error propagation when a bit shift error occurs in Table 14 is a maximum of 5 bits.

Hence, by arranging the table used for data demodulation as shown in Table 14, the scale of hardware is reduced, and the worst error propagation characteristics when there is a bit shift error are improved.

Summarizing the above, even when all the elements are listed for the restriction length and decoding table as in Table 12, it is not necessarily possible to shorten the worst error propagation. Also, even if the last 2 bits (d bits) are omitted from all the elements for a restriction length i=3 in restriction length determining and the table, as in Table 13, the worst error propagation is not necessarily shortened.

This invention maybe applied also to the demodulation of other (d,k)=(1,7) codes as shown in, for example, Table 15, Table 16 and Table 17. In this case, the restriction length i parts of Table 15, Table 16 or Table 17 are retained in the reverse conversion tables 14-i.

TABLE 15

RML (1, 7; 2, 3; 3)

| | Data | Code |
|---|---|---|
| i = 1 | 11 | x00 |
| | 10 | 010 |
| | 01 | x01 |
| i = 2 | 0011 | x00 000 |
| | 0010 | 010 000 |
| | 0001 | x00 001 |
| | 0000 | 010 001 |
| i = 3 | 100110 | 010 000 001 |

In Table 15, even in a code sequence which is inverted from beginning to end, repetition of the minimum run can be limited. In this case, the minimum run is repeated for a maximum of up to 5 times.

TABLE 16

RML (1, 7; 2, 3; 3)

| | Data | Code |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |
| i = 3 | 011001 | 100 000 010 |

In Table 15, the case "100110" was specified for a restriction length i=3 as a Tmin repeat restriction code, but the same effect can be obtained by, for example, modifying the restriction length i=3 part of Table 15 to "011001" in Table 16. The minimum run of Table 16 is repeated for a maximum of up to 5 times.

TABLE 17

RML (1, 7; 2, 3; 4)

| | Data | Code |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |
| i = 3 | 100110 | 100 000 010 |
| i = 4 | 01100111 | 001 000 000 010 |
| | 01100110 | 100 000 001 00x |
| | 01100101 | 101 000 000 010 |
| | 01100100 | 100 000 001 010 |

In Table 5 and Table 16 the case "100110" or "011001" was specified for a restriction length i=3 as a Tmin repeat restriction code. However, the same effect can be obtained, for example, by supplying a Tmin repeat restriction code for a restriction length i=4 as in Table 17, in which more codes have been added to Table 15. The minimum run of Table 16 is repeated for a maximum of up to 5 times.

The inventors performed a simulation of error propagation after demodulation when an edge bit shift occur on the demodulation results for d=1 according to the code limiting repetition of Tmin. Arbitrarily generated random data was modulated by the RML(1,7) modulating code, and the result obtained when the edge "1" was shifted backwards or forward about every other 101 channel bits in the code sequence was demodulated. For codes which did not exist in the tables (e.g. 3 bits), a corresponding number of bits (e.g. 2 bits) was demodulated as "0". The extent of error propagation was evaluated by comparing the demodulated data a sequence comprising errors and the data sequence demodulated by the correct code sequence.

The same simulation was performed on data demodulated by a prior art RLL(1,7) code, and the effect of error propagation due to the restriction length of the table was examined.

First, the results obtained when data was modulated using RML(1,7;2,3;3) shown in Table 3 and demodulated using Table 5 after generating a bit shift error are as follows. Error propagation when a forward bit shift error is introduced is up to 9 bits. The size of the data sequence is 10,922,660.

| [Forward bit shift] | | | | |
|---|---|---|---|---|
| 0 bit 0 | | | | |
| 1 bit 102137 | 2 bit 7955 | 3 bit 23845 | 4 bit 11133 | 5 bit 11531 |
| 6 bit 2662 | 7 bit 2474 | 8 bit 282 | 9 bit 198 | 10 bit 0 |
| average-length: 2.03 (329097/162217) | | | | |
| [Backward bit shift] | | | | |
| 0 bit 0 | | | | |
| 1 bit 108738 | 2 bit 4964 | 3 bit 17115 | 4 bit 15889 | 5 bit 6326 |
| 6 bit 6852 | 7 bit 2050 | 8 bit 283 | 9 bit 0 | 10 bit 0 |
| average-length: 1.99 (322923/162217) | | | | |

In these tables, bits are numbers of bits in which an error was propagated, and the following figure is the number of occurrences. For example, for a forwardbit shift, the number of times an error occurred over 5 bits was 11531. The denominator of the average length represents the number of points where an error occurred, and the numerator represents the total number of bits in which an error occurred. For example, for a forward bit shift, the number of points where an error occurred was 162217, and the total number of bits in which an error occurred was 329097 (=0×0+1×102137+ 2×7955+3×23845+. . . +9×198+10×0).

Next, the results obtained when data was modulated using RML(1,7;2,3;3) shown in Table 3 and demodulated using Table 7 after generating a bit shift error are as follows. Error propagation when a forward bit shift error was introduced is up to 8 bits. This shows that the compared to the demodulating method of Table 5, the demodulating method of Table 7 leads to a decrease of the worst error propagation.

| [Forward bit shift] | | | | |
|---|---|---|---|---|
| 0 bit 0 | | | | |
| 1 bit 104616 | 2 bit 7955 | 3 bit 22613 | 4 bit 11133 | 5 bit 10782 |
| 6 bit 2662 | 7 bit 2174 | 8 bit 282 | 9 bit 0 | 10 bit 0 |
| average-length: 1.97 (320253/162217) | | | | |
| [Backward bit shift] | | | | |
| 0 bit 0 | | | | |
| 1 bit 108738 | 2 bit 4964 | 3 bit 14628 | 4 bit 15889 | 5 bit 6326 |
| 6 bit 9339 | 7 bit 2050 | 8 bit 283 | 9 bit 0 | 10 bit 0 |
| average-length: 2.04 (330384/162217) | | | | |

Hence, the invention limits the repeat frequency of the minimum run, and therefore offers the following advantages.

(1) Compared to the prior art, there are fewer parts with a low signal level, so the precision of waveform processing such as AGC or PLL is improved and overall characteristics are enhanced.

(2) Compared to the prior art, the path memory length during Viterbi decoding, etc. , can be designed to be shorter, and the circuit scale can be reduced.

Further, according to this invention, the worst error propagation when a bit shift error occurs can be reduced by taking the demodulation technique used into consideration.

In addition to recording media such as magnetic disks, CD-ROM and solid memories, as media for transmitting the program which performs the aforesaid processing to the user, communication media such as networks and satellites may also be used.

What is claimed:

1. A demodulating device which converts a variable length code (d,k;m,n;r) having a basic code length of n bits into data having a basic data length of m bits, comprising:

comparator means for comparing a reproduced signal with a predetermined level, and outputting a code sequence for inserting a minimum of d and a maximum of k "0"s in a continuous series of "1"s, decoding means for decoding a restriction code assigned to limit the same minimum run d of "0"s from consecutively repeating a predetermined plurality of times between respective "1"s in a code sequence of "1"s and "0"s, into a predetermined data sequence, detecting means for detecting said restriction code from said code sequence of "1"s and "0"s, and restriction length determining means for determining a restriction length of said code sequence from the output of said detecting means and said code sequence of "1"s and "0"s.

2. A demodulating device as claimed in claim 1, further comprising selecting means for selecting, corresponding to said restriction length, a decoding result obtained by said decoding means, which decodes the code in which said restriction code was determined into an m bit datasequence from an n bit code sequence using plural tables corresponding to said restriction length.

3. A demodulating device as claimed in claim 2, wherein all codes of a demodulation table in said demodulating device comprise "1" showing an edge.

4. A demodulating device as claimed in claim 2, wherein, in a demodulation table in said demodulating device, a code of up to d bits is omitted from the code sequence length.

5. A demodulating device as claimed in claim 2, wherein, in demodulation tables of said demodulating device corresponding to respective restriction length, at least one of plural codes comprises all bits of the code sequence length.

6. A demodulating device as claimed in claim 2, wherein said restriction code in a table of said decoding means and said detecting means is a code which does not occur in combinations of codes other than said restriction code.

7. A demodulating method which converts a variable length code (d,k;m,n;r) having a basic code length of n bits into data having a basic data length of m bits, comprising:

a comparator step for comparing a reproduced signal with a predetermined level, and outputting a code sequence for inserting a minimum of d and a maximum of k "0"s in a continuous series of "1"s, a decoding step for decoding a restriction code assigned to limit the same minimum run d of "0"s from consecutively repeating a predetermined plurality of times between respective "1"s in a code sequence of "1"s and "0"s, into a predetermined data sequence, a detecting step for detecting said restriction code from said code sequence of "1"s and "0"s, and a restriction length determining step for determining a restriction length of said code sequence from the output of said detecting step and said code sequence of"1"s and "0"s.

8. A transmitting medium for transmitting a program used in a demodulating device which converts a variable length code (d,k;m,n;r) having a basic code length of n bits into data having a basic data length of m bits, wherein said program comprises:

a comparator step for comparing a reproduced signal with a predetermined level, and outputting a code sequence for inserting a minimum of d and a maximum of k "0"s in a continuous series of "1"s, a decoding step for decoding a restriction code assigned to limit the same minimum run d of "0" from consecutively repeating a predetermined plurality of times between respective "1"s in a code sequence of "1"s and "0"s, into a predetermined data sequence, a detecting step for detecting said restriction code from said code sequence of "1"s and "0"s, and a restriction length determining step for determining a restriction length of said code sequence from the output of said detecting step and said code sequence of "1"s and "0"s.

* * * * *